(12) United States Patent
Yoon et al.

(10) Patent No.: US 8,436,474 B2
(45) Date of Patent: May 7, 2013

(54) SEMICONDUCTOR INTEGRATED CIRCUIT

(75) Inventors: Young-Hee Yoon, Gyeonggi-do (KR); Ju-Young Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 187 days.

(21) Appl. No.: 12/832,272

(22) Filed: Jul. 8, 2010

(65) Prior Publication Data

US 2011/0291289 A1     Dec. 1, 2011

(30) Foreign Application Priority Data

May 27, 2010 (KR) .................. 10-2010-0049585

(51) Int. Cl.
*H01L 23/52* (2006.01)
(52) U.S. Cl.
USPC .......................................... 257/774
(58) Field of Classification Search ............ 257/774, 257/773, E23.174, E23.011
See application file for complete search history.

(56) References Cited

U.S. PATENT DOCUMENTS

| | | | | |
|---|---|---|---|---|
| 6,307,259 B1 * | 10/2001 | Asada et al. | ................ | 257/691 |
| 6,891,260 B1 * | 5/2005 | Mora et al. | ................ | 257/691 |
| 7,081,650 B2 * | 7/2006 | Palanduz et al. | ............. | 257/310 |
| 2006/0055049 A1 * | 3/2006 | Nelson et al. | ................ | 257/774 |
| 2010/0225005 A1 * | 9/2010 | Nishio et al. | ................ | 257/774 |

FOREIGN PATENT DOCUMENTS

| | | |
|---|---|---|
| JP | 2000-306771 | 11/2000 |
| JP | 2007-250933 | 9/2007 |
| JP | 2010-034407 | 2/2010 |
| KR | 100463946 | 12/2004 |

OTHER PUBLICATIONS

Notice of Allowance issued by the Korean Intellectual Property Office on Mar. 19, 2012.

* cited by examiner

*Primary Examiner* — Thao P. Le
(74) *Attorney, Agent, or Firm* — IP & T Group LLP

(57) ABSTRACT

A semiconductor integrated circuit includes first power supply through-chip vias formed through the semiconductor chip to be in a line in a first direction of the semiconductor chip, second power supply through-chip vias formed through the semiconductor chip to be in, first power lines arranged in a second direction, wherein each of the plurality of first power lines is coupled to each of the first power supply through-chip vias, and second power lines arranged in the second direction, wherein each of the plurality of second power lines is coupled to each of the second power supply through-chip vias.

15 Claims, 7 Drawing Sheets

SEMICONDUCTOR INTEGRATED CIRCUIT

CROSS-REFERENCE TO RELATED APPLICATION

The present application claims priority of Korean Patent Application No. 10-2010-0049585, filed on May 27, 2010, which is incorporated herein by reference in its entirety.

BACKGROUND OF THE INVENTION

Exemplary embodiments of the present invention relate to semiconductor design technology, and more particularly, to a semiconductor integrated circuit.

In general, packaging technology for semiconductor integrated circuits has been continuously developed to satisfy demands for miniaturization and mounting reliability. As demand increases for high-performing, miniature electronic products, a variety of technologies for a stack package are being developed.

In the semiconductor industry, "stack" means vertically stacking two or more semiconductor chips or packages. When a stack package is applied to a semiconductor memory device, a product having a memory capacity two or more times larger than a memory capacity which can be fabricated by a semiconductor integration process may be realized. Furthermore, the stack package not only increases the memory capacity, but also offers advantages in terms of packaging density and the efficient use of the mounting area.

The stack package may be fabricated by the following methods. First, individual semiconductor chips may be stacked, and then packaged at once. Second, packaged individual semiconductor chips may be stacked. The individual semiconductor chips of the stacked semiconductor package may be coupled through metallic wires or through silicon vias (TSV). The stack package using TSVs may have such a structure that the physical and electrical coupling between semiconductor chips is vertically achieved by TSVs formed in the respective semiconductor chips.

FIG. 1 is a perspective view illustrating the configuration of a stack package semiconductor integrated circuit.

Referring to FIG. 1, the semiconductor integrated circuit 100 includes first to third semiconductor chips 110 to 130, which are vertically stacked, and a plurality of TSVs 140 to 160, which are formed through the first to third semiconductor chips 110 to 130 and configured to transmit signals and power among the first to third semiconductor chips 110 to 130.

The first to third semiconductor chips 110 to 130 may be categorized as a master chip and slave chips, depending on their functions. For example, the third semiconductor chip 130 may serve as the master chip, and the first and second semiconductor chips 110 and 120 may serve as the slave chips. In this case, the third semiconductor chip 130 may receive signals and power from outside, transfer the signals and power to the first and second semiconductor chips 110 and 120, and control the first and second semiconductor chips 110 and 120.

The plurality of TSVs 140 to 160 configured to transmit signals and powers may be formed of a metal, for example, Cu. Each of the semiconductor chips 110 to 130 may include several hundred to several thousand TSVs formed therethrough.

SUMMARY OF THE INVENTION

Exemplary embodiments of the present invention are directed to a semiconductor integrated circuit having a power coupling structure, which is capable of reducing a voltage drop.

In accordance with an exemplary embodiment of the present invention, a semiconductor integrated circuit includes a plurality of first power supply through-chip vias formed through a semiconductor chip to be in a line in a first direction of the semiconductor chip, a plurality of second power supply through-chip vias formed through the semiconductor chip to be in a line in the first direction, a plurality of first power lines arranged in a second direction, wherein each of the plurality of first power lines is coupled to each of the first power supply through-chip vias, and a plurality of second power lines arranged in the second direction, wherein each of the plurality of second power lines is coupled to each of the second power supply through-chip vias.

In accordance with another embodiment of the present invention, a semiconductor integrated circuit includes a plurality of first and second power supply through-chip vias formed through a semiconductor chip and alternately arranged in a first area of the semiconductor chip to be in a line in a first direction, another plurality of first and second power supply through-chip vias alternately arranged in a second area of the semiconductor chip to be in a line in the first direction and having an arrangement sequence which is opposite to the arrangement sequence of the first and second power supply through-chip vias arranged in the first area, a plurality of first power lines arranged in a second direction, wherein each of the plurality of first power lines is coupled to each of the first power supply through-chip vias, and a plurality of second power lines arranged in the second direction, wherein each of the plurality of second power lines is coupled to each the second power supply through-chip vias.

DESCRIPTION OF SPECIFIC EMBODIMENTS

Figure 1:
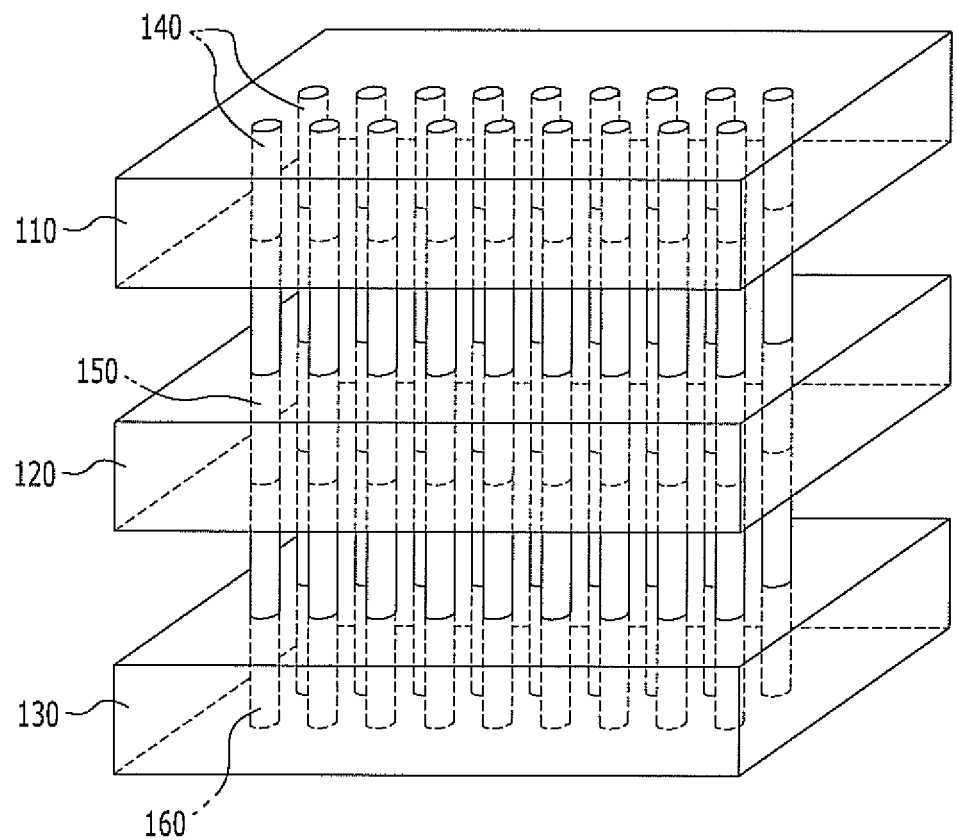
FIG. 1 is a perspective view illustrating the configuration of a conventional semiconductor integrated circuit having a stack package structure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

For convenience of description, one semiconductor chip including a plurality of TSVs formed therethrough will be taken as an example in a semiconductor integrated circuit in accordance with exemplary embodiments of the present invention. However, the semiconductor integrated circuit may include a plurality of stacked semiconductor chips as illustrated in FIG. 1.

Figure 2:
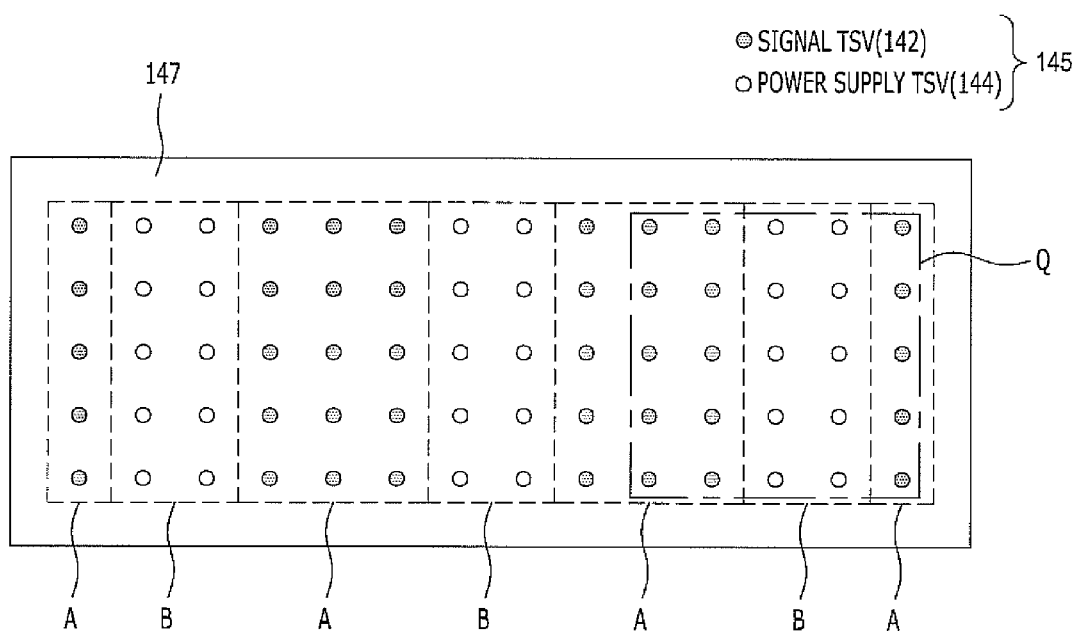
FIG. 2 is a plan view of the semiconductor integrated circuit in accordance with an embodiment of the present invention.

FIG. 2 is a plan view of the semiconductor integrated circuit in accordance with an exemplary embodiment of the present invention.

Referring to FIG. 2, the plurality of TSVs 145 which vertically pass through the semiconductor chip 147 are arranged in a lattice shape in the semiconductor chip 147. That is, the TSVs 145 passing through the semiconductor chip 147 may be arranged at even intervals in columns and rows.

Meanwhile, the plurality of TSVs may be divided into signal TSVs 142 for transferring signals and power supply TSVs 144 for supplying power. Here, for example, less power supply TSVs 144 may be formed than the number of signal TSVs 142. Further, the power supply TSVs 144 may be uniformly arranged in order to stably supply power to the semiconductor chip 147. In other words, a plurality of first areas A may include the signal TSVs 142 arranged in one or more lines, while a plurality of second areas B may include the power supply TSVs 144 arranged in two lines. Moreover, as shown in FIG. 2, the first areas A and the second areas B may be alternately formed.

Figure 3:
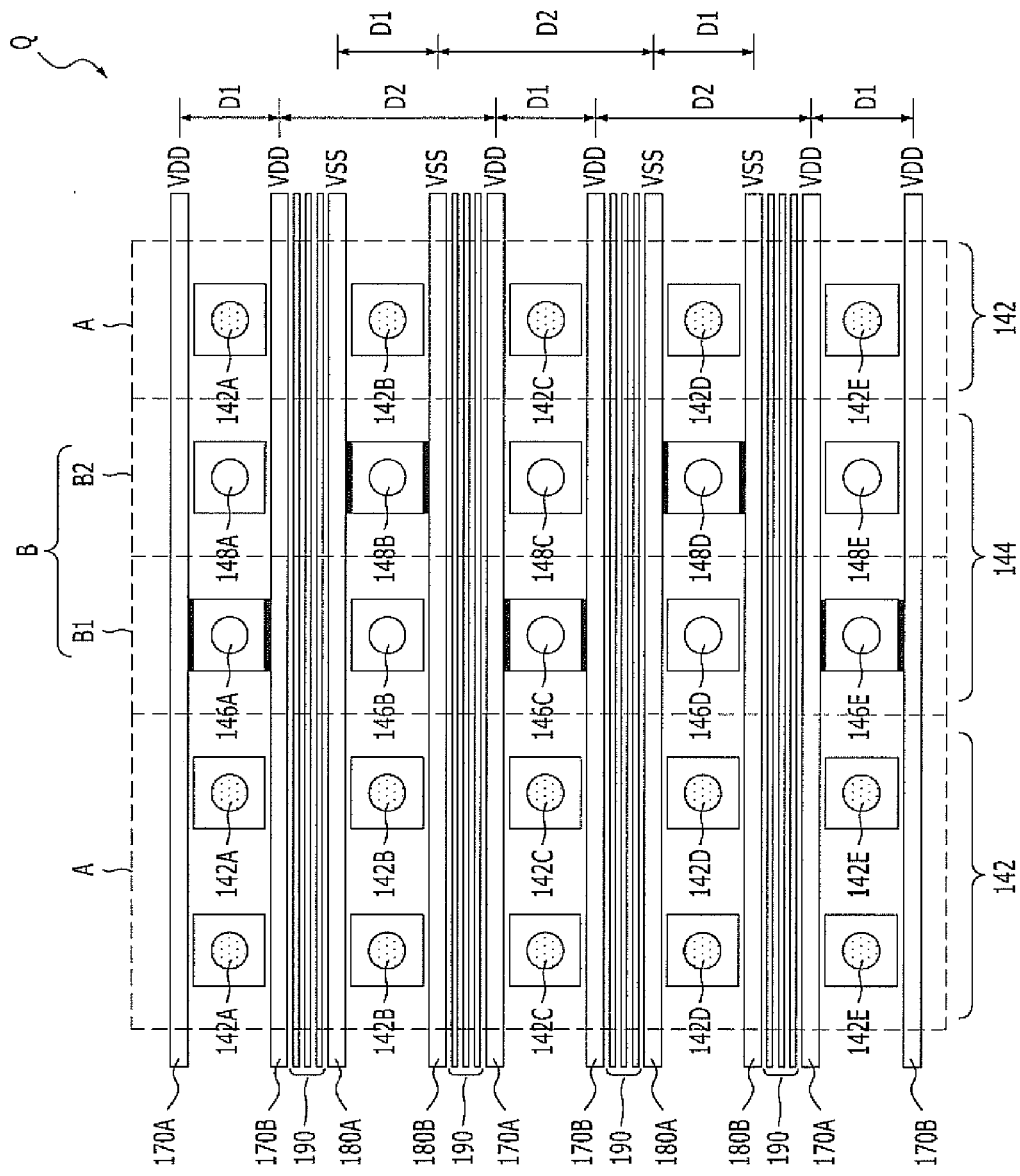
FIG. 3 is a diagram illustrating a portion Q of FIG. 2.

FIG. 3 illustrates a portion Q of FIG. 2, in order to describe the semiconductor integrated circuit of FIG. 2 in more detail.

Referring to FIG. 3, the semiconductor integrated circuit includes the first and second areas A and B which are alternately formed as described above. In particular, the second area B may be divided into a third area B1 and a fourth area B2. The third area B1 includes power supply voltage (VDD) TSVs 146A to 146E arranged in one line, and the fourth area B2 includes ground voltage (VSS) TSVs 148A to 148E arranged in another line. In other words, the power supply TSVs 144 are divided into the power supply voltage TSVs 146A to 146E and the ground voltage TSVs 148A to 148E.

Furthermore, the semiconductor integrated circuit includes plural pairs of first power lines 170A and 170B and plural pairs of second power lines 180A and 180B which are alternately arranged with the signal TSVs 142A to 142E, the power supply voltage TSVs 146A to 146E, and the ground voltage TSVs 148A to 148E, which are adjacent to each other in a direction. For example, the pair of first power lines 170A and 170B are arranged in such a manner that the signal TSVs 142A, 142C, or 142E, the power supply voltage TSV 146A, 146C, or 146E, and the ground voltage 148A, 148C, or 148E, which are arranged adjacent to each other in an odd number line in the row direction, are interposed between the pair of first power lines 170A and 170B. Furthermore, the pair of second power lines 180A and 180B are arranged in such a manner that the signal TSVs 142B or 142D, the power supply voltage TSV 146B or 146D, and the ground voltage TSV 148B or 148D, which are arranged adjacent to each other in an even number line in the row direction, are interposed between the pair of second power lines 180A and 180B. Here, the first power lines 170A and 170B for the power supply voltage VDD are coupled to the power supply voltage TSVs 146A, 146C, and 146E. The second power lines 180A and 180B for the ground voltage VSS are coupled to the ground voltage TSVs 148B and 148D. Meanwhile, although not illustrated in detail, the TSVs 146B, 146D, 148A, 148C, and 148E, which are not coupled to the first power lines 170A and 170B and the second power lines 180A and 180B, may be coupled to a lower metal layer, when it is assumed that the layer illustrated in FIG. 3 is an upper metal layer. The lower metal layer may be separated from the upper metal layer by an interlayer dielectric layer.

Meanwhile, the semiconductor integrated circuit includes a plurality of signal lines 190 coupled to the signal TSVs 142A to 142E.

Referring to FIG. 3, both the first power lines 170A and 170B and the second power lines 180A and 180B are arranged in uneven intervals. For example, the first power lines 170A and 170B are arranged in such a manner that a distance D1 between an arbitrary pair of first power lines 170A and 170B is set to be different from a distance D2 between an adjacent pair of first power lines 170B and 170A (D1≠D2). Also, the second power lines 180A and 180B are arranged in the same manner. If the first power lines 170A and 170B and the second power lines 180A and 180B are arranged in uneven intervals, a voltage drop may occur, and thus, the power supply may be unstable.

Furthermore, among the power supply TSVs 144, the power supply voltage TSVs 146B and 146D and the ground voltage TSVs 148A, 148C, and 148E are not coupled to the first power lines 170A and 170B or the second power lines 180A and 180B. Accordingly, there may be a limit to which the power supply TSVs 144 can stably supplying power to the power lines 170A and 170B and the second power lines 180A and 180B.

Figure 4:
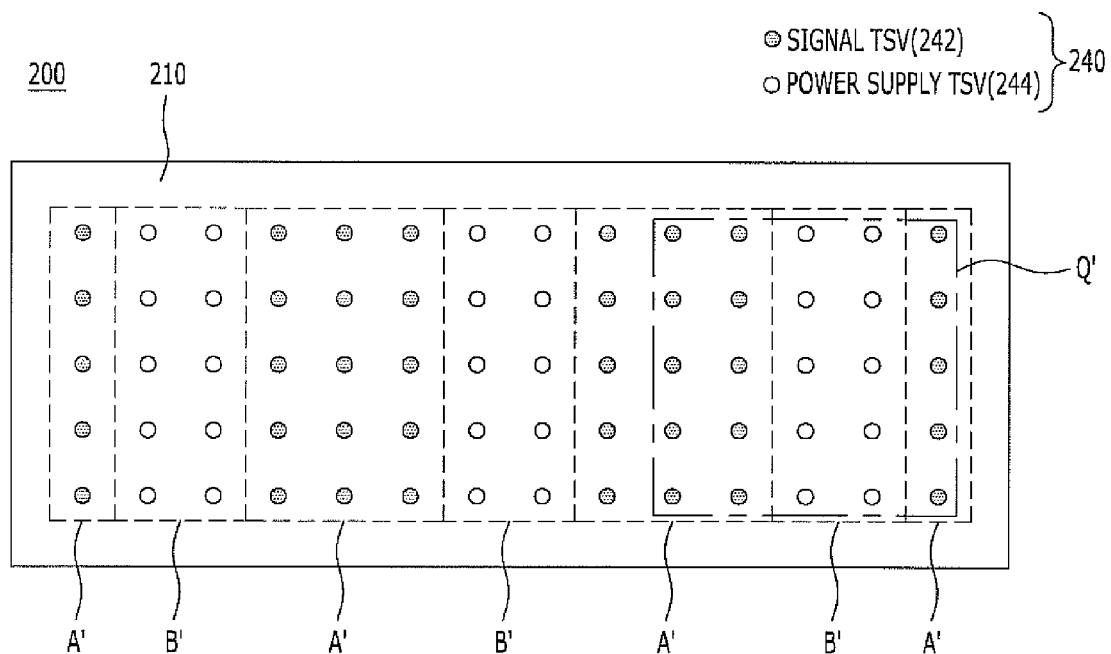
FIG. 4 is a plan view of a semiconductor integrated circuit in accordance with another exemplary embodiment of the present invention.

FIG. 4 is a plan view of a semiconductor integrated circuit in accordance with another exemplary embodiment of the present invention.

Referring to FIG. 4, the semiconductor integrated circuit 200 includes a semiconductor chip 210 and a plurality of TSVs 240 passing through the semiconductor chip 210.

The semiconductor chip 210 refers to a typical silicon substrate including a variety of devices, for example, a MOS transistor and so on.

The plurality of TSVs 240 may transmit data signals or power supply signals between the stacked semiconductor chips which are not illustrated. Therefore, the plurality of TSVs 240 may be formed of a metal, for example, Cu. Each of the semiconductor chips may include several hundred to several thousand TSVs formed through the semiconductor chip. The plurality of TSVs 240 may be divided into signal TSVs 242 for transferring data signals and power supply TSVs 244 for supplying power. Here, for example, the number of power supply TSVs 244 may be set to be smaller than the number of signal TSVs 242. Further, the power supply TSVs 244 may be uniformly arranged throughout the entire semiconductor chip 210, in order to stably supply power to the entire region of the semiconductor chip 210. For example, a plurality of first areas A' each may include the signal TSVs 242 arranged in one or more lines, while a plurality of second areas B' may each include the power supply TSVs 244 arranged in two lines. Moreover, as shown in FIG. 4, the first areas A' and the second areas B' may be alternately formed.

Figure 5:
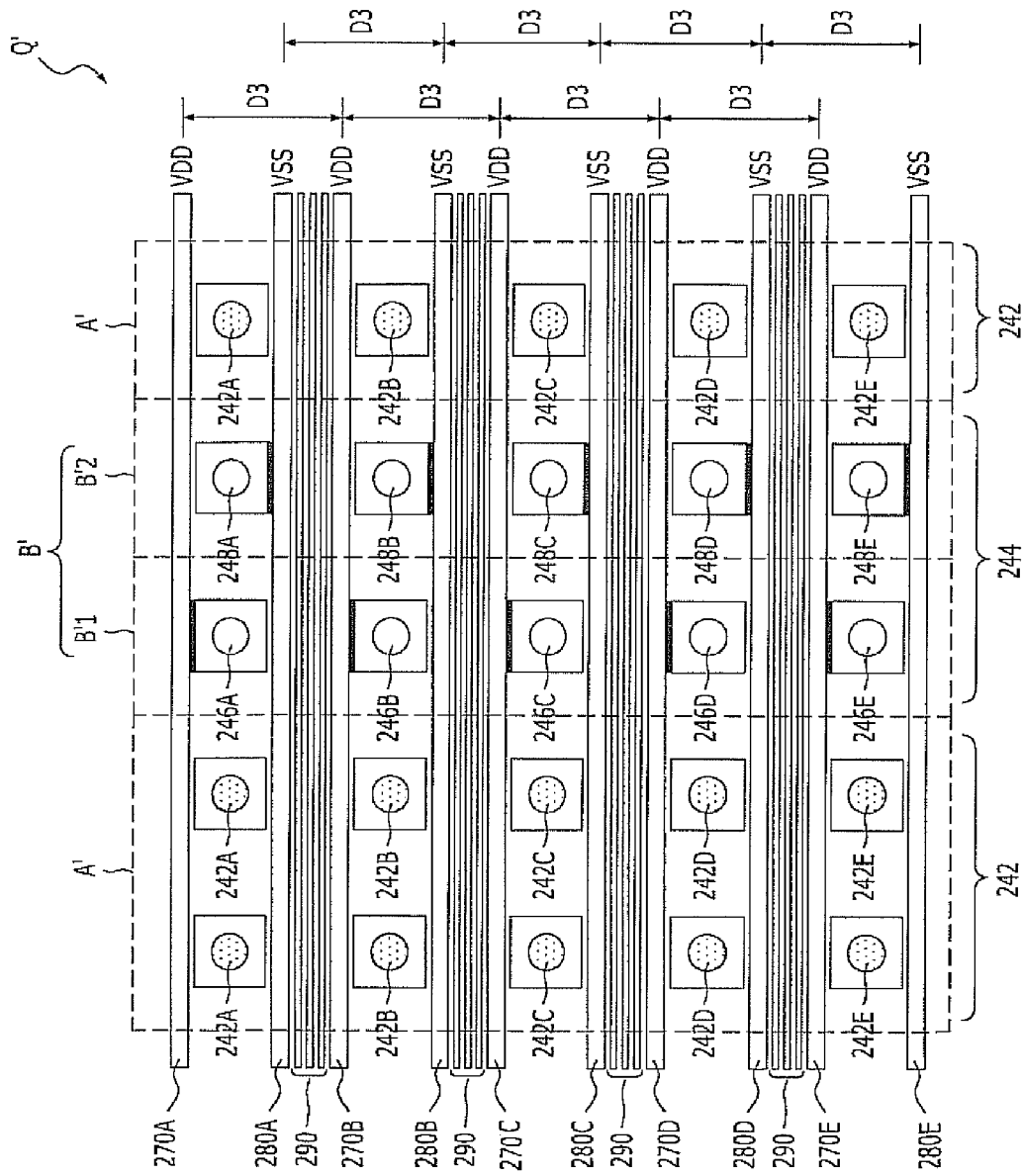
FIG. 5 is a diagram illustrating a portion Q' of FIG. 4.

FIG. 5 illustrates a portion Q' of FIG. 4, in order to describe the semiconductor integrated circuit 200 of FIG. 4 in more detail.

Referring to FIG. 5, the first area A' includes a plurality of signal TSVs 242A to 242E arranged to form one or more lines.

The second area B' includes a plurality of power supply voltage (VDD) TSVs 246A to 246E arranged to be in a line in the column direction and a plurality of ground voltage (VSS) TSVs 248A to 248E arranged to be in a line parallel to the power supply voltage TSVs 246A to 246E. In other words, the second area B' may be divided into an area 13'1 and an area B'2. Here, for example, the plurality of power supply voltage TSVs 246A to 246E are arranged in the area B'1, and the plurality of ground voltage TSVs 248A to 248E are arranged in the area B'2. In other words, the power supply TSVs 244 may be divided into the plurality of power supply voltage TSVs 246A to 246E and the plurality of ground voltage TSVs 248A to 248E.

Meanwhile, the semiconductor integrated circuit 200 includes a plurality of first power lines 270A to 270E disposed in parallel to each other at one side of the signal TSVs 242A to 242E, the power supply voltage TSVs 246A to 246E, and the ground voltage TSVs 248A to 248E. More specifically, the first power lines 270A to 270E are parallel to each other in the row direction of the semiconductor chip 210. For example, the first power line 270A is disposed along one side of the signals TSV 242A, the power supply voltage TSV 246A, and the ground voltage TSV 248A, which are adjacent to each other in the row direction. The other first power lines 270B to 270E are disposed in a similar manner. The plurality of power lines 270A to 270E for power supply voltage VDD are electrically coupled to the power supply voltage TSVs 246A to 246E, respectively. Furthermore, the first power lines 270A to 270E are arranged at the same distance D3 from each other, and thus, have a uniform arrangement structure.

The semiconductor integrated circuit 200 includes a plurality of second power lines 280A to 280E disposed in parallel to each other at the other side of the signal TSVs 242A to 242E, the power supply voltage TSVs 246A to 246E, and the ground voltage TSVs 248A to 248E. More specifically, the second power lines 280A to 280E are parallel to each other in the row direction of the semiconductor chips 210. For example, the second power line 280A is disposed along the other side, from the first power line 270A, of the signals TSV 242A, the power supply voltage TSV 246A, and the ground voltage TSV 248A, which are arranged adjacent to each other in the row direction. The other second power lines 280B to 280E are disposed in a similar manner. The plurality of second power lines 280A to 280E for ground voltage VDD are electrically coupled to the ground voltage TSVs 248A to 248E, respectively. Furthermore, the second power lines 280A to 280E are arranged at the same distance D3 from each other, and thus, have a uniform arrangement structure.

In other words, the first power lines 270A to 270E and the second power lines 280A to 280E, respectively, are disposed to form a pair of power lines for supplying power to the signal TSVs, the power supply voltage TSV, and the ground voltage TSV, which are arranged adjacent to each other in the row direction. Therefore, signal TSVs, power supply voltage TSVs, and ground voltage TSVs are interposed between the first power lines 270A to 270E and the second power lines 280A to 280E, respectively. For example, the first power line 270A and the second power line 280A form a pair of power lines for supplying power to the signal TSVs 242A, the power supply voltage TSV 246A, and the ground voltage TSV 248A interposed between the first power line 270A and the second power line 280A. Therefore, the power supply voltage TSVs 246A to 246E and the ground voltage TSVs 248A to 248E, which are arranged to be in a line in the column direction, may be coupled to the corresponding first power lines 270A to 270E and the corresponding second power lines 280A to 280E, respectively.

In accordance with this exemplary embodiment of the present invention, the first power lines 270A to 270E are arranged at the substantially same distance D3 from each other. Likewise, the second power lines 280A to 280E are arranged at the substantially same distance D3 from each other. Further, the power supply voltage TSVs 246A to 246E and the ground voltage TSVs 248A to 248E are coupled to the corresponding first power lines 270A to 270E and the corresponding second power lines 280A to 280E. Therefore, the entire power supply of the semiconductor chip 210 may be stabilized.

Figure 6:
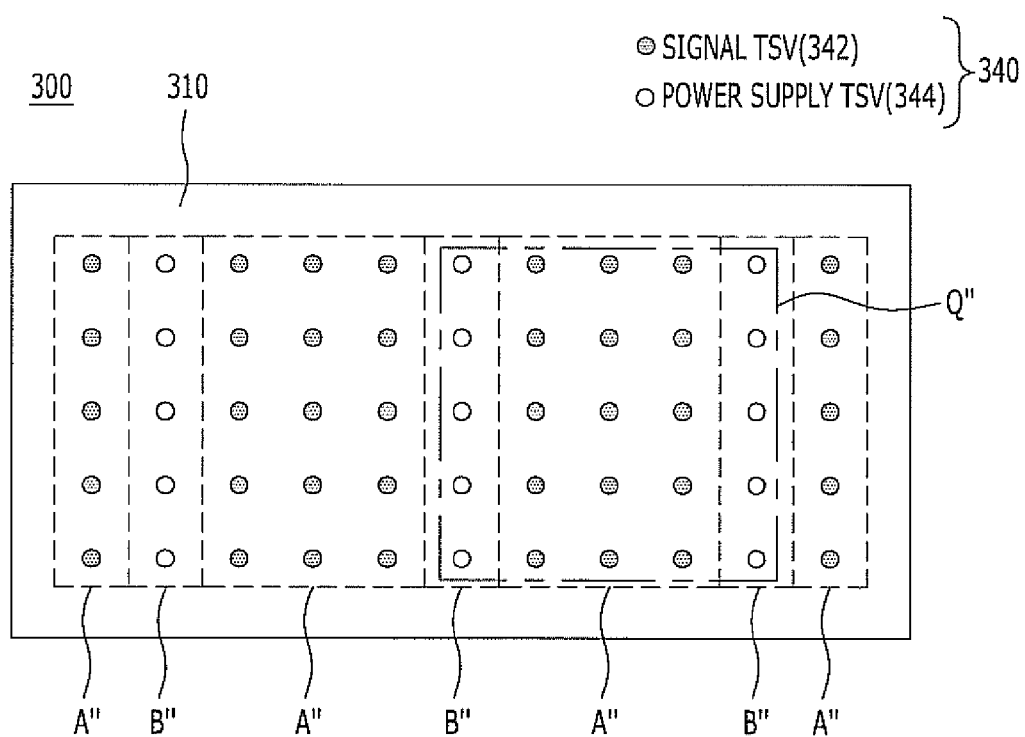
FIG. 6 is a plan view of a semiconductor integrated circuit in accordance with yet another exemplary embodiment of the present invention.

FIG. 6 is a plan view of a semiconductor integrated circuit in accordance with yet another exemplary embodiment of the present invention.

Referring to FIG. 6, the semiconductor integrated circuit 300 includes a semiconductor chip 310 and a plurality of TSVs 340 passing through the semiconductor chip 310.

The semiconductor chip 310 refers to a typical silicon substrate including a variety of devices, for example, a MOS transistor and so on.

The plurality of TSVs 340 are configured to transmit signals or power between stacked semiconductor chips which are not illustrated. Therefore, the plurality of TSVs 340 may be formed of a metal, for example, Cu. Each of the semiconductor chips may include several hundred to several thousand TSVs formed therethrough. The plurality of TSVs 340 may be divided into signal TSVs 342 for transferring signals and power supply TSVs 344 for supplying power. Here, for example, the number of power supply TSVs 344 may be set to be smaller than the number of signal TSVs 342. Further, the power supply TSVs 344 may be uniformly arranged throughout the entire semiconductor chip 310, in order to stably supply power to the entire region of the semiconductor chip 310. For example, a plurality of first areas A" each may include the signal TSVs 342 arranged in one or more lines, while a plurality of second areas B" may each include the power supply TSVs 344 arranged in one line. Moreover, as shown in FIG. 6, the first areas A" and the second areas B" may be alternately formed.

Figure 7:
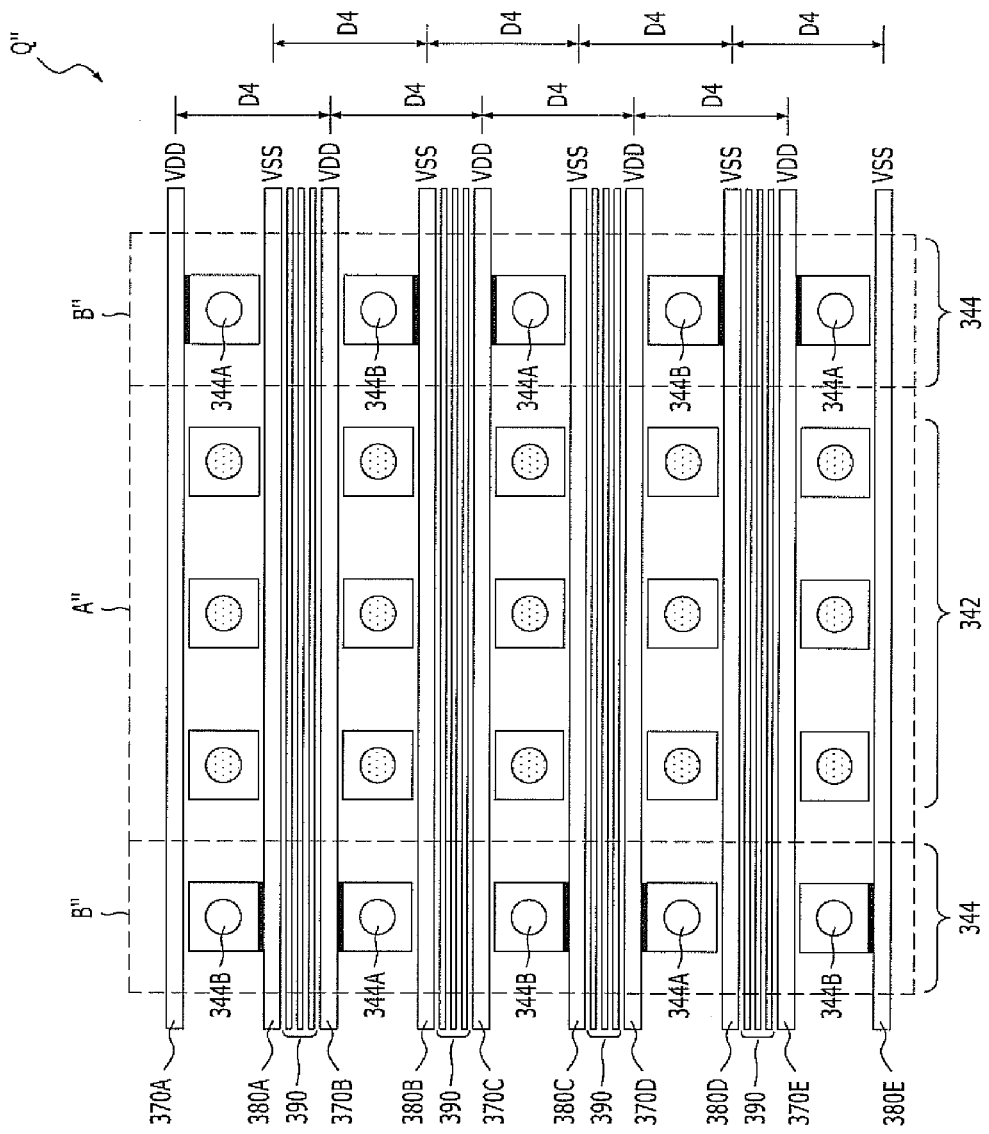
FIG. 7 is a diagram illustrating a portion Q" of FIG. 6.

FIG. 7 illustrates a portion Q" of FIG. 6, in order to describe the semiconductor integrated circuit 300 of FIG. 6 in more detail.

Referring to FIG. 7, the first area A" includes a plurality of signal TSVs 342A to 342E arranged to be in multiple lines in a column direction.

The second area B" includes a plurality of power supply TSVs 344 arranged to be in a line in the column direction. Here, the power supply TSVs 344 may include power supply voltage (VDD) TSVs 344A and ground voltage (VSS) TSVs 344B. The power supply voltage TSVs 344A and the ground voltage TSVs 344B are alternately arranged in the second area B". In this case, the arrangement sequence of the power supply voltage TSVs 344A and the ground voltage TSVs 344B which are arranged in an arbitrary second area B" may be opposite to the arrangement sequence of the power supply voltage TSVs 344A and the ground voltage TSVs 344B which are arranged in another arbitrary second area B" adjacent to the arbitrary second area B". For example, the arrangement sequence of the arbitrary second area B" positioned in the right side of FIG. 7 may be set in such a manner that the power supply voltage TSVs 334A and the ground voltage TSVs 344B are alternately arranged in a state in which one of power supply voltage TSVs 344A is positioned in a first row. In this case, the arrangement sequence of the second area B" adjacent to the arbitrary second area B" (e.g., adjacent arbitrary second area B" positioned in the left side of the FIG. 7) may be set in such a manner that the ground voltage TSVs 344B and the power supply voltage TSVs 344A are alternately arranged in a state in which one of ground voltage TSVs 344B is positioned in the first row. In such an arrangement, a parasitic capacitor is formed between the power supply voltage TSV 344A and the ground voltage TSV 344B which are arranged adjacent to each other in the column direction. In this case, although noise is introduced into the power supply voltage TSVs 344A and the ground voltage TSVs 344B, the parasitic capacitor formed in such a manner has a strong characteristic against the noise. The parasitic capacitor may play the same role as a reservoir capacitor.

Meanwhile, the semiconductor integrated circuit 300 includes a plurality of power lines 370A to 370E disposed in parallel to each other at one side of the power supply voltage TSVs 344A and the ground voltage TSVs 344B which are arranged in a line in the row direction of the semiconductor chip 310. For example, the first power line 370A is disposed in parallel to one side of the ground voltage TSV 344B and the power supply voltage TSV 344A which are arranged in the line in the row direction. The first power lines 370A to 370E for power supply voltage VDD are electrically coupled to the respective power supply voltage TSVs 344A arranged in the second area B". Furthermore, the first power lines 370A to 370E are arranged at the substantially same distance D4 from each other, and thus, have a uniform arrangement structure.

Furthermore, the semiconductor integrated circuit 300 includes a plurality of second power lines 380A to 380E disposed in parallel to each other at the other side of the power supply voltage TSVs 344A and the ground voltage TSV 344B which are arranged adjacent to each other in the row direction of the semiconductor chip 310. For example, the second power line 380A is disposed along the other side, from the first power line 370A, of the ground voltage TSV 344B and the power supply voltage TSV 344A which are arranged adjacent to each other in the row direction. The second power lines 380A to 380E for ground voltage VSS are electrically coupled to the respective ground voltage TSV 344B arranged in the second area B". Furthermore, the second power lines 380A to 380E are arranged at the substantially same distance D4 from each other as in the first power lines 370A to 370E, and thus, have a uniform arrangement structure.

In other words, the first power lines 370A to 370E and the second power lines 380A to 380E, respectively, are arranged to form a pair of power lines for supplying power to the ground voltages TSV 344B and the power supply voltages TSV 344A, which are arranged adjacent to each other in the row direction, and interposed between the first power lines 370A to 370E and the second power lines 380A to 380E, respectively. For example, the first power line 370A and the second power line 380A are arranged to form a pair of power lines for supplying power to the ground voltage TSV 344B and the power supply voltage TSV 344A interposed between the first power line 370A and the second power line 380A. Therefore, the power supply voltage TSVs 344A and the ground voltage TSVs 344B which are alternately arranged in the column direction may be coupled to the corresponding first power lines 370A to 370E and the corresponding second power lines 380A to 380E, respectively.

In accordance with this exemplary embodiment of the present invention, since the first power lines 370A to 370E and the second power lines 380A to 380E are arranged at the same distance D4 from each other, the entire power supply of the semiconductor chip 210 may be stabilized, and may have a strong characteristic against noise, due to the parasitic capacitor.

In accordance with the exemplary embodiments of the present invention, the first and second power lines, respectively, are arranged at the same distance from each other to substantially prevent a voltage drop. Therefore, the power supply may be stabilized.

Furthermore, since the plurality of power supply TSVs are all coupled to the corresponding power lines, the power supply may be stabilized and a power distribution may be effective.

Furthermore, since corresponding power lines are arranged at the same distance from each other, the number of power supply TSVs may be reduced and therefore, chip area may be more effectively utilized.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit comprising:
  a plurality of first power supply through-chip vias, formed through a semiconductor chip in a first line oriented in a first direction of the semiconductor chip;
  a plurality of second power supply through-chip vias, formed through the semiconductor chip in a second line oriented in the first direction;
  a plurality of first power lines, arranged in a second direction, wherein each of the plurality of first power lines is coupled to a corresponding one of the plurality of first power supply through-chip vias; and
  a plurality of second power lines, arranged in the second direction, wherein each of the plurality of second power lines is coupled to a corresponding one of the plurality of second power supply through-chip vias,
  wherein the plurality of first power lines and the plurality of second power lines are arranged on the same semiconductor chip.

2. The semiconductor integrated circuit of claim 1, wherein the plurality of first power lines are arranged at the substantially same distance from each other, and the plurality of second power lines are also arranged at the substantially same distance from each other.

3. The semiconductor integrated circuit of claim 2, wherein the plurality of first power supply through-chip vias are configured to transmit a power supply voltage, and the plurality of second power supply through-chip vias are configured to transmit a ground voltage.

4. The semiconductor integrated circuit of claim 3, wherein the plurality of first power lines are configured to transmit a power supply voltage, and the plurality of second power lines are configured to transmit a ground voltage.

5. The semiconductor integrated circuit of claim 1, further comprising a plurality of signal through-chip vias arranged between the first power line and the second power line.

6. The semiconductor integrated circuit of claim 5, wherein the plurality of first and second power supply through-chip vias are arranged in a plurality of first areas, the plurality of signal through-chip vias are arranged in a plurality of second areas, and the plurality of first and second areas are alternately arranged in the second direction.

7. The semiconductor integrated circuit of claim 6, further comprising a plurality of signal lines formed between the first power line and the second power line, wherein each of the plurality of signal lines is coupled to each of the plurality of signal through-chip vias.

8. The semiconductor integrated circuit of claim 1, wherein the through-chip vias comprise through silicon vias (TSVs).

9. A semiconductor integrated circuit comprising:
  a first plurality of first and second power supply through-chip vias, formed through the first area of the semiconductor chip, wherein the first plurality of first and second power supply through-chip vias, are alternately arranged, in a first arrangement sequence, along a first line oriented in a first direction;
  a second plurality of first and a second plurality of second power supply through-chip vias, formed through the second area of the semiconductor chip, wherein the second plurality of first and second power supply through-chip vias are alternately arranged, in a second arrangement sequence that is opposite to the first arrangement sequence, along a second line oriented in the first direction;

a plurality of first power lines, arranged in a second direction, wherein each of the plurality of first power lines is coupled to a corresponding one of the first power supply through-chip vias; and a plurality of second power lines, arranged in the second direction, wherein each of the plurality of second power lines is coupled to a corresponding one of the second power supply through-chip vias, wherein the plurality of first and second power lines are arranged on the same semiconductor chip.

10. The semiconductor integrated circuit of claim 9, wherein the plurality of first power lines are arranged at the substantially same distance from each other, and the plurality of second power lines are also arranged at the substantially same distance from each other.

11. The semiconductor integrated circuit of claim 10, wherein the first plurality of first power supply through-chip vias, arranged in the first area, and the second plurality of first power supply through-chip vias, arranged in the second area, are configured to transmit a power supply voltage, and the first plurality of second power supply through-chip vias, arranged in the first area, and the second plurality of second power supply through-chip vias, arranged in the second area, are configured to transmit a ground voltage.

12. The semiconductor integrated circuit of claim 11, wherein the plurality of first power lines comprise power lines for a power supply voltage, and the plurality of second power lines comprise power lines for a ground voltage.

13. The semiconductor integrated circuit of claim 9, further comprising a plurality of signal through-chip vias provided in a third area, wherein the plurality of signal through-chip vias are arranged between the first power line and the second power line.

14. The semiconductor integrated circuit of claim 13, further comprising a plurality of signal lines formed between the first power line and the second power line, wherein each of the plurality of signal lines is coupled to each of the plurality of signal through-chip vias.

15. The semiconductor integrated circuit of claim 9, wherein the through-chip vias comprise through silicon vias (TSVs).

* * * * *